(12) United States Patent
Tomie

(10) Patent No.: US 6,369,324 B1
(45) Date of Patent: *Apr. 9, 2002

(54) HIGH-FREQUENCY INPUT/OUTPUT FEEDTHROUGH AND PACKAGE FOR HOUSING A HIGH-FREQUENCY SEMICONDUCTOR ELEMENT

(75) Inventor: Satoru Tomie, Gamo-gun (JP)

(73) Assignee: Kyocera Corporation, Kyoto (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/140,791

(22) Filed: Aug. 27, 1998

(30) Foreign Application Priority Data

Aug. 28, 1997 (JP) .............................. 9-233153

(51) Int. Cl.$^7$ ................................ H02G 3/08
(52) U.S. Cl. ..................... 174/52.1; 361/820; 174/52.4
(58) Field of Search ............................. 174/52.1, 52.2, 174/52.3, 52.4, 260, 36; 361/820, 821; 333/245, 246

(56) References Cited

U.S. PATENT DOCUMENTS

| | | | | |
|---|---|---|---|---|
| 4,487,999 A | * | 12/1984 | Baird et al. ................ | 174/52 S |
| 4,525,766 A | * | 6/1985 | Petersen ..................... | 361/283 |
| 4,611,186 A | * | 9/1986 | Ziegner ...................... | 333/246 |
| 5,239,126 A | * | 8/1993 | Oshiba ....................... | 174/35 R |
| 5,241,456 A | * | 8/1993 | Marcinkiewicz et al. ... | 361/792 |
| 5,294,751 A | * | 3/1994 | Kamada ..................... | 174/52.4 |
| 5,315,486 A | * | 5/1994 | Fillion et al. ............... | 361/795 |
| 5,499,005 A | * | 3/1996 | Gu et al. .................... | 333/246 |
| 5,558,928 A | * | 9/1996 | DeStefano et al. ......... | 428/209 |
| 5,923,234 A | * | 7/1999 | Holzman et al. ........... | 333/238 |
| 6,023,211 A | * | 2/2000 | Somei ........................ | 333/246 |

FOREIGN PATENT DOCUMENTS

| | | |
|---|---|---|
| JP | 58022741 | 2/1983 |
| JP | 2089851 | 7/1990 |
| JP | 5183301 | 7/1993 |

* cited by examiner

*Primary Examiner*—Dean A. Reichard
*Assistant Examiner*—W. David Walkenhorst
(74) *Attorney, Agent, or Firm*—Hogan & Hertson, LLP

(57) ABSTRACT

In a conventional high-frequency input/output feedthrough having a microstrip line, for a millimeter wave band, the reliability of a hermetic seal portion was low and transmission characteristics in the millimeter wave band were not preferable. A high-frequency input/output feedthrough of the present invention includes: a dielectric substrate with a ground conductor on a bottom face thereof; a wall member joined onto the top face of the dielectric substrate; a pair of line conductors formed in line with each other on both sides of the wall member on the top face of the dielectric substrate; an inside-layer line conductor which is formed to be in line and parallel with the pair of line conductors below the wall member inside the dielectric substrate, both ends of which are electrically connected by through conductors, to respective end portions of the pair of line conductors on both sides of the wall member, wherein an interval of the through conductors are set to be a quarter of a wavelength of a high-frequency signal to be used. The high-frequency input/output feedthrough is characterized by a hermetic seal portion of high reliability and preferable transmission characteristics.

6 Claims, 10 Drawing Sheets

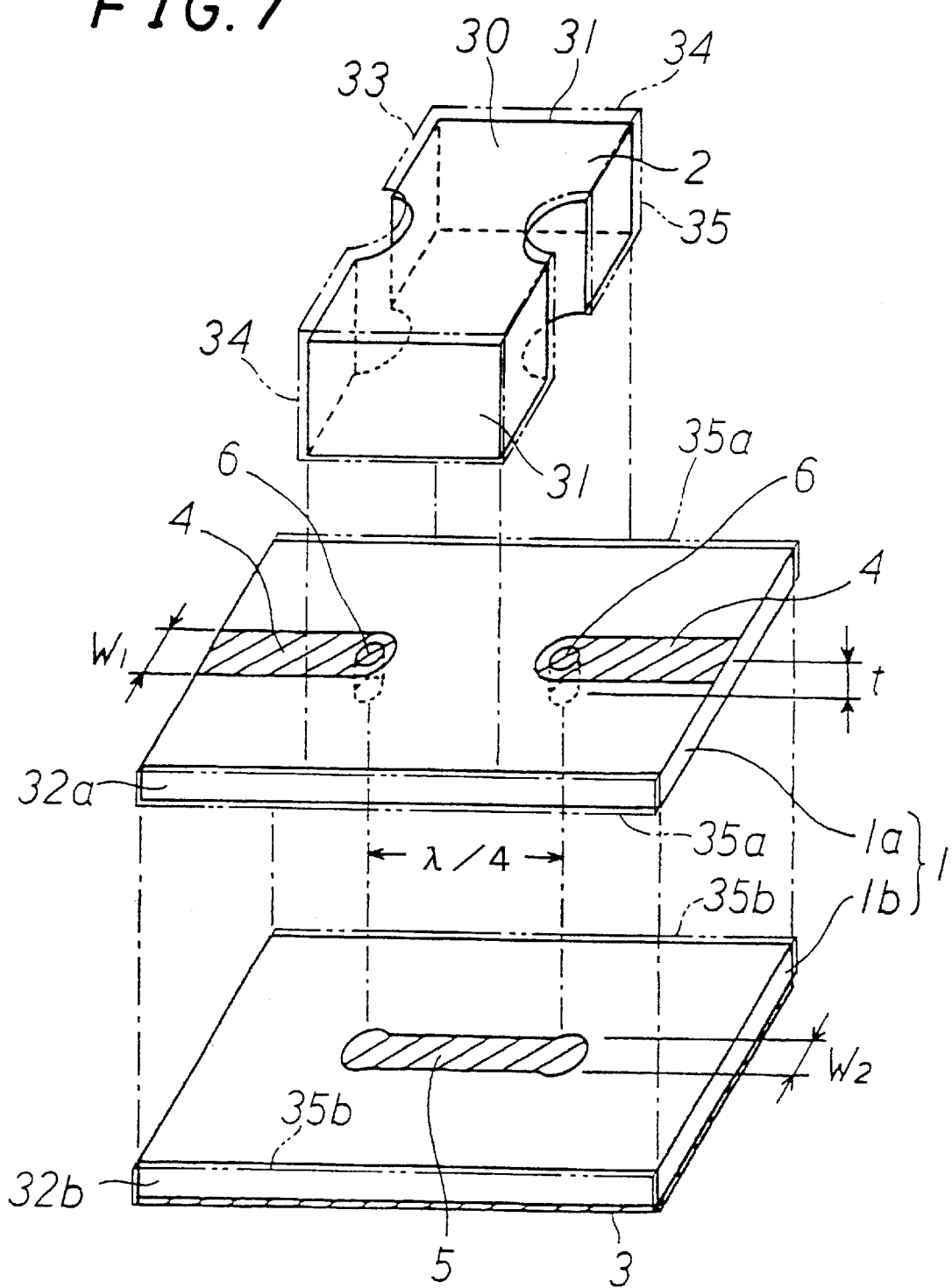

HIGH-FREQUENCY INPUT/OUTPUT FEEDTHROUGH AND PACKAGE FOR HOUSING A HIGH-FREQUENCY SEMICONDUCTOR ELEMENT

BACKGROUND OF THE INVENTION

1. Field of the Invention

The present invention relates to a high-frequency input/output feedthrough used for a high-frequency input/output portion of a package for housing a high-frequency semiconductor element for the millimeter wave band or the like, and also relates to a package for housing a high-frequency semiconductor element using the high-frequency input/output feedthrough.

2. Description of the Related Art

A package for housing a high-frequency semiconductor element houses a high-frequency semiconductor element or the like which uses a high-frequency signal in the microwave band, the millimeter wave band or the like, in a hermetically sealed manner. A signal input/output portion of such a package generally employs a structure in which a microstrip line formed on a dielectric substrate and a strip line of a hermetic seal portion are joined together as high-frequency transmission lines, and the high-frequency semiconductor element housed in the package in a hermetically sealed manner is connected to an external circuit via a high-frequency input/output feedthrough thus structured.

As such a high-frequency input/output feedthrough, Japanese Unexamined Patent Publication JP-A 5-183301 (1993), for example, discloses a package input/output portion for super-high frequency band, comprising a line portion forming a hermetic seal portion of a package, an outer line portion for connecting to the outside of the package and an inner line portion for connecting to an internal circuit, the outer and inner line portions being connected to respective ends of the line portion, wherein the length of the line portion forming the hermetic seal portion is selected to be ½ n (n is a natural number), namely an integral multiple of ½, of a signal wavelength.

According to this package input/output portion, the length of the line portion of a strip line portion or the like forming the hermetic seal portion is selected to be an integral multiple of ½ of the signal wavelength λ, so that it is possible to prevent a reflection caused by the difference of transmission modes due to the difference of shapes in the outer line portion and the line portion and in the inner line portion and the line portion, and prevent a reflection caused in a case where the characteristic impedance is different because production accuracy is not sufficient and hence the dimension deviates from a design value. Accordingly, the package input/output portion can be produced in a simple fashion to reduce a cost, and can prevent a reflection to improve characteristics in the super-high frequency band.

The conventional high-frequency input/output feedthrough thus configured has been produced in the following manner. Respective line portions are formed by a metallized metal layer made of tungsten, molybdenum or the like on a dielectric substrate made of alumina ceramics or the like, on which an upper dielectric forming a hermetic seal portion is joined, or on which a cap formed by a dielectric material is adhered after a dielectric coating is applied to the line portion of the hermetic seal portion. After that, a plating layer of, for example, nickel and gold is adhered to the surface of the metallized metal layer of the exposed line portion so that a bonding wire or bonding ribbon made of gold is preferably joined thereon.

Further, there are provided packages for housing a high-frequency semiconductor element equipped with the thus configured high-frequency input/output feedthrough in various configuration types such as a so-called metal wall type that a metal substrate and a metal frame forming a case wall are cut away to form an attaching portion for fitting the high-frequency input/output feedthrough thereinto; a so-called ceramic wall type that in a dielectric substrate and a dielectric frame forming a case wall is formed an attaching portion for the high-frequency input/output feedthrough; a configuration that the high-frequency input/output feedthrough is fitted into the dielectric substrate and the metal frame; and a configuration that the high-frequency input/output feedthrough of the above configuration is integrated into the dielectric substrate and the dielectric frame.

In the conventional high-frequency input/output feedthrough as shown in JP-A 5-183301, it is necessary to select the length of the strip line portion forming the hermetic seal portion to be n/2 (n represents a natural number) of the signal wavelength λ. Therefore, in a higher frequency band, for example, over 30 GHz (the millimeter wave band), it is necessary to shorten the length of the hermetic seal portion.

However, in the case where the length of the hermetic seal portion is shortened as mentioned above, there arises the following problems. Since a metal layer serving as the line portion is disposed between dielectrics which are placed above and below this portion, an adhesion strength between the dielectrics is extremely lowered and delamination is caused. In the case where such a hermetic seal portion is used in the package for housing a semiconductor element, when thermal stress is applied at the time of packaging the semiconductor element, cap-sealing, or secondarily mounting, the seal of the hermetic seal portion is impaired.

Furthermore, the thus configured high-frequency input/output feedthrough has a problem that in a high frequency band such as the millimeter wave band, due to the relationship between positions of a ground metallized layer and a seal metallized layer which form the strip line portions and a position of the strip line, or in the case where the feedthrough is used in the package for housing a semiconductor element, between positions of the metal substrate, frame and so on and a position of the strip line, resonance of a dielectric which is called slot resonance is produced, which will often show itself in a specific frequency band with the result that the transmission characteristics for high-frequency signals are extremely impaired.

Still more, in the case of adhering the plating layer to the exposed line conductor, due to a bad circulation of plating solution toward a finely structured portion, it is difficult to completely cover with the plating layer, up to a part where the microstrip line enters into the hermetic seal portion. Therefore, when moisture contained in the air adheres to the microstrip line portion in this part, the moisture contacts the metallized metal layer and the plating layer to work as electrolyte, thereby causing a battery action that a current flows between the metallized metal layer and the plating layer based on the differences in energy level of both the metals. This causes a problem that, due to so-called corrosion that the metal of the metallized metal layer having a lower energy level is gradually melt down because of the battery action, the metallized metal layer, that is, the line conductor is broken in the end.

SUMMARY OF THE INVENTION

The invention has been conducted in view of the above-discussed problems. It is an object of the invention to provide a high-frequency input/output feedthrough which transmits a high-frequency signal via a microstrip line and has a hermetic seal portion of a package, wherein the highly reliable feedthrough can prevent the hermetic seal portion from being delaminated and from being damaged due to thermal stress by improving an adhesion strength of the hermetic seal portion, has excellent transmission characteristics to a high-frequency signal in a desired specific frequency band, and causes no break in a line conductor due to corrosion.

It is another object of the invention to provide a package for housing a high-frequency semiconductor element which transmits a high-frequency signal via a microstrip line and is equipped with a high-frequency input/output feedthrough portion having a hermetic seal portion, wherein the highly reliable package can prevent the hermetic seal portion from being delaminated and from being damaged due to thermal stress by improving an adhesion strength of the hermetic seal portion, has excellent transmission characteristics to a high-frequency signal in a desired specific frequency band, and causes no break in a line conductor due to corrosion.

In a first aspect of the invention, there is provided a high-frequency input/output feedthrough comprising:

a dielectric substrate having a ground conductor on a bottom face thereof;

a wall member which is joined onto a top face of the dielectric substrate and made of a dielectric or conductive material;

a pair of line conductors formed in line with each other on both sides of the wall member on the top face of the dielectric substrate; and an inside-layer line conductor which is formed to be in line and parallel with the pair of line conductors below the wall member inside the dielectric substrate, both ends of the inside-layer line conductor being electrically connected by through conductors to respective end portions of the pair of line conductors on both sides of the wall member, respectively, wherein an interval of the through conductors is set to be a quarter of a wavelength of a high-frequency signal to be used.

In a second aspect of this invention, a width (W2) of the inside-layer line conductor is selected to be equal to or narrower than a width (W1) of the pair of line conductors (W1≧W2)

In a third aspect of this invention, the wall member is made of a dielectric material, a top face ground conductor is provided on the top face of the wall member, and side-face ground conductors are provided on respective side faces of the wall member and the dielectric substrate, respectively.

In a fourth aspect of the invention, there is provided a package for housing a high-frequency semiconductor element comprising:

a substrate having a mounting portion for mounting a high-frequency semiconductor element on a top face thereof;

a frame joined onto the substrate so as to surround the mounting portion;

an input/output feedthrough attaching portion which is formed by cutting away the frame, a bottom face of the portion being made conductive; and a high-frequency input/output feedthrough of any one of the above-mentioned configurations which is fitted into the input/output feedthrough attaching portion.

In a fifth aspect of the invention, there is provided a package for housing a high-frequency semiconductor element comprises:

a dielectric substrate having a ground conductor on a bottom face thereof and a mounting portion for mounting a high-frequency semiconductor element on a top face thereof;

a dielectric frame joined onto the top face of the dielectric substrate so as to surround the mounting portion;

a pair of line conductors formed in line with each other on both sides of the dielectric frame on the top face of the dielectric substrate; and an inside-layer line conductor which is formed to be in line and parallel with the pair of line conductors below the dielectric frame inside the dielectric substrate, both ends of the inside-layer line conductor being electrically connected by through conductors to respective end portions of the pair of line conductors on both sides of the dielectric frame, respectively, wherein an interval of the through conductors is set to be a quarter of a wavelength of a high-frequency signal to be used.

In a sixth aspect of this invention, a width (W2) of the inside-layer line conductor is selected to be equal to or narrower than a width W1) of the pair of line conductors (W1≧W2).

According to the high-frequency input/output feedthrough of the invention, no line conductor is interposed by the dielectric substrate and the wall member, so that an adhesion strength between them is increased and hence they can be firmly joined to each other. Therefore, as a hermetic seal portion, it is possible to make the feedthrough have a highly reliable hermetic seal structure, in which delamination will not occur and the seal of the hermetic seal portion will not be impaired when thermal stress is applied at the time of packaging a semiconductor element, cap-sealing or secondarily mounting, in a case where the feedthrough is used in a package for housing a semiconductor element.

Further, regarding a high-frequency band such as the millimeter wave band, not only preferable transmission characteristics to the high-frequency signal to be used can be obtained, but also slot resonance is not generated in a specific frequency band with the result that transmission characteristics of the high-frequency signal are not degraded.

Still more, the line conductors do not have parts to enter under the wall member, and in the case of adhering the plating layer to the exposed line conductors, it is easy to completely cover the whole exposed surface of the line conductors as well as to form the thickness thereof to be uniform. Therefore, it never occurs that the metal of the base conductor layer is melt down due to corrosion, thereby breaking the line conductors.

As mentioned above, according to the invention, it is possible to improve the adhesion strength of the wall member serving as the hermetic seal portion so as to prevent the hermetic seal portion from being delaminated and being damaged due to thermal stress, as well as to provide a highly reliable high-frequency input/output feedthrough which has excellent transmission characteristics with respect to a high-frequency signal to be used in a desired specific frequency band and causes no break due to corrosion in the line conductors.

According to the high-frequency input/output feedthrough of the invention, the top face ground conductor is provided on the top face of the wall member and the side-face ground conductors are disposed on the side faces of the wall member and the dielectric substrate, respectively, whereby these ground conductors are caused to have an ideal ground potential with the result that shielding high-frequency signals is reliably attained.

Further, the package for housing a high-frequency semiconductor element of the invention is equipped with the above-described high-frequency input/output feedthrough of the invention as a high-frequency input/output feedthrough. Therefore, the package can hermetically seal in a highly reliable manner as a hermetic seal portion and can obtain preferable transmission characteristics to the high-frequency signal to be used, so that it never occurs that the metal of the base conductor layer is melt down due to corrosion to break the line conductors.

As mentioned above, according to the invention, it is possible to prevent the hermetic seal portion from being delaminated and being damaged due to thermal stress by improving the adhesion strength of the hermetic seal portion, as well as to provide a highly reliable package for housing a high-frequency semiconductor element which has excellent transmission characteristics to the high-frequency signal to be used in a desired specific frequency band, and which causes no break of the line conductor due to corrosion.

BRIEF DESCRIPTION OF THE DRAWINGS

Other and further objects, features, and advantages of the invention will be more explicit from the following detailed description taken with reference to the drawings wherein:

FIG. 7 is an exploded perspective view showing the embodiment of a high-frequency input/output feedthrough of the invention;

DETAILED DESCRIPTION OF THE PREFERRED EMBODIMENTS

Figure 1:
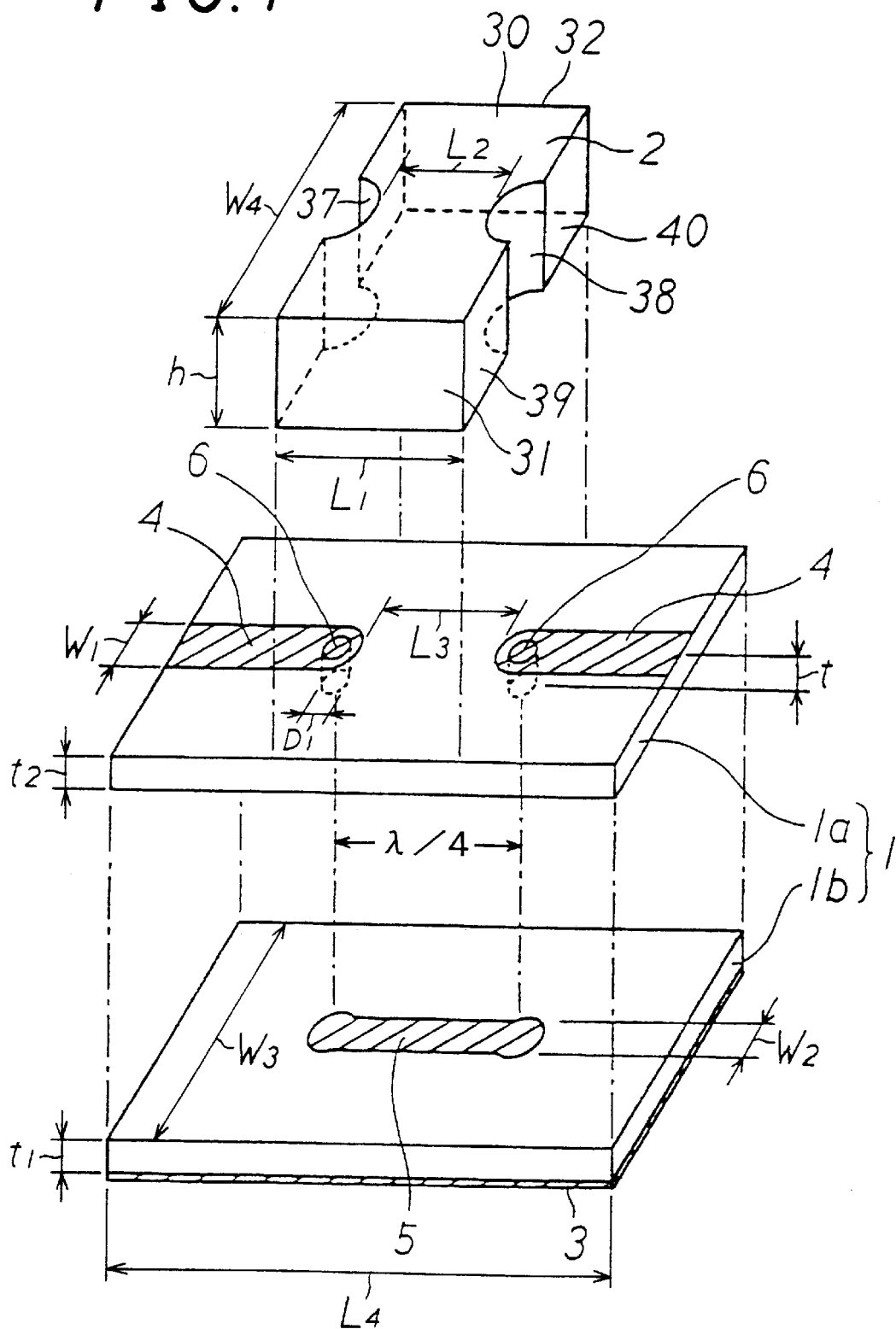
FIG. 1 is an exploded perspective view showing an embodiment of a high-frequency input/output feedthrough of the invention.

Now referring to the drawings, preferred embodiments of the invention are described below.

Figure 2:
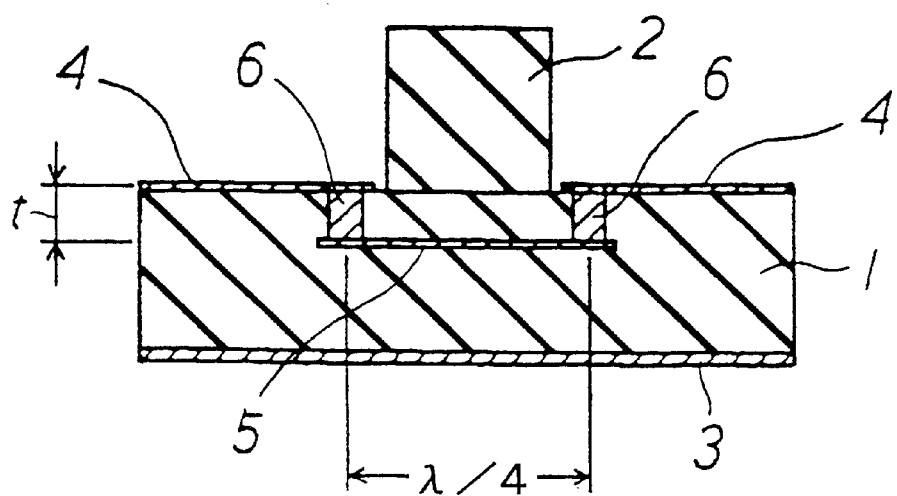
FIG. 2 is a sectional view showing the embodiment of a high-frequency input/output feedthrough of the invention.

FIGS. 1 and 2 show an embodiment of a high-frequency input/output feedthrough of the invention, respectively. FIG. 1 is an exploded perspective view, and FIG. 2 is a sectional view taken along line conductors. In the drawings, components may be described by hatching for convenience of understandings.

In FIG. 1, as a dielectric substrate 1 are laminated dielectric layers 1a and 1b. A wall member 2, which is made of a dielectric or conductive material, is joined onto the top face of the dielectric substrate 1. They form a hermetic seal portion at a signal input/output portion of a package for housing a high-frequency semiconductor element.

The dielectric substrate 1 has a ground conductor 3 at the bottom face thereof. On the top face of the dielectric substrate 1 is formed a pair of line conductors 4, 4 having a matched characteristic impedance to be in line with each other on both sides of the wall member 2 so as to become a microstrip line, respectively. Below the wall member 2 inside the dielectric substrate 1 is formed an inside-layer line conductor 5 similar to the line conductor 4 to be in line and parallel with the pair of line conductors 4, 4 between the dielectric layers 1a and 1b.

Both ends of the inside-layer line conductor 5 are electrically connected by through conductors 6, 6 to respective end portions of the pair of line conductors 4, 4 on both sides of the wall member 2, respectively, and an interval between these through conductors 6, 6 is set to be a quarter of a wavelength $\lambda$ ($\lambda/4$) of a high-frequency signal to be used which is transmitted by the high-frequency input/output feedthrough. With respect to the wavelength $\lambda$ of the high-frequency signal to be used, a deviation between a measured value and a set value is caused in actual by the dielectric constants, shapes and so on of the dielectric substrate 1 and the wall member 2. In a case where such a deviation is caused, the interval may be set to be a quarter of an effective wavelength $\lambda_{eff}$ of the high-frequency signal to be used. Even though the interval is not precisely $\lambda/4$, a deviation in which a target passband characteristic can be ensured with respect to the high-frequency signal to be used which is transmitted by the high-frequency input/output feedthrough can be permitted.

According to the high-frequency input/output feedthrough of the invention, on the top face of the dielectric substrate 1 having the ground conductor 3 at the bottom face thereof, the pair of line conductors 4, 4 are formed in line with each other on both sides of the wall member 2 which is joined onto the dielectric substrate 1 and which is made of a dielectric or conductive material for forming the hermetic seal portion when the feedthrough is used in the package. At the same time, below the wall member 2 inside the dielectric substrate 1 is formed the inside-layer line conductor 5 to be in line and parallel with the pair of line conductors 4, 4, and both ends of the inside-layer line conductor 5 are electrically connected by the through conductors 6, 6 to respective end portions of the pair of line conductors 4, 4 on both sides of the wall member 2, respectively, and furthermore, the interval between the through conductors 6, 6 is set to be a quarter of the wavelength λ of the high-frequency signal to be used. Accordingly, a line conductor used in the conventional high-frequency input/output feedthrough is not interposed by the dielectric substrate 1 and the wall member 2, so that the adhesion strength of the dielectric substrate 1 and the wall member 2 is increased so as to make them firmly join to each other. Thus, a high-frequency input/output feedthrough with a highly reliable hermetic seal structure as a hermetic seal portion can be realized in which delamination is not caused and, in the case where the feedthrough is used for a package for housing a semiconductor element, the hermetic seal portion is not impaired even when thermal stress is applied at the time of packaging a semiconductor element, cap-sealing or secondarily mounting.

Further, regarding a high-frequency band such as the millimeter wave band, the high-frequency input/output feedthrough of the invention has capacitance component between the inside-layer line conductor 5 and the ground conductor 3, and has inductance component at the through conductor 6. Therefore, for the purpose of matching the characteristic impedance of the line conductor 4 on the dielectric substrate 1 and the inside-layer line conductor 5 and further suppressing higher order modes to eliminate the difference in transmission modes of the high-frequency signal to be used and reduce return losses, it is not necessary to considerably decrease the width W2 of the inside-layer line conductor 5 with respect to the width W1 of the line conductor 4 on the dielectric substrate 1 as conventionally conducted. Moreover, since the line conductor 4, the inside-layer line conductor 5 and the through conductor 6 are not complicatedly shaped, a difference of transmission modes due to the irregularities in production or an increase of return losses and insertion losses are not caused, and hence preferable transmission characteristics to the high-frequency signal to be used can be obtained.

Furthermore, also in a high frequency band such as the millimeter wave band, the interval between the two through conductors 6 is set to be λ/4, whereby an apparent open end of one of the line conductors 4 can transmit with the highest power to the other line conductor 4 via the through conductors 6 and the inside-layer line conductor 5. Therefore, slot resonance produced between the dielectric around the conventional high-frequency input/output feedthrough and the ground conductor is not produced in a specific frequency band, and hence the transmission characteristics for a high-frequency signal are not impaired.

Still more, since the line conductors 4 on the top face of the dielectric substrate 1 are formed as the pair of line conductors 4, 4 on both sides of the wall member 2, these line conductors 4 do not have parts to enter under the wall member 2. Even when the circulation of plating solution toward a finely structured portion is bad as conventional in the case of adhering the plating layer to the exposed line conductors 4, it is easy to completely cover the whole exposed surface of the line conductors 4 with the plating layer as well as to form the thickness thereof to be uniform. Therefore, even when moisture contained in the air adheres to the coating plating layer, the moisture never contacts a base conductor layer made of metallized metal layer or the like. Since the battery action due to entry of moisture is not caused in the base conductor layer, it never occurs that the metal of the base conductor layer is melt down due to so-called corrosion to break the line conductors 4.

As a result, according to the high-frequency input/output feedthrough of the invention, it is possible to improve the adhesion strength of the wall member 2 serving as the hermetic seal portion so as to prevent the wall member from being delaminated and from being damaged due to thermal stress, as well as to obtain a high-frequency input/output feedthrough of high reliability which has excellent transmission characteristics to the high-frequency signal to be used in a desired specific frequency band and causes no break due to corrosion in the line conductors 4.

In the high-frequency input/output feedthrough of the invention, the dielectric substrate 1 and the wall member 2 of a dielectric material are formed by, for example: a ceramics material such as alumina, mullite and the like; glass ceramics; or a resin material such as a fluorine resin such as Teflon (polytetrafluoroethylene (PTFE), product name) as a seal equivalent to the hermetic seal or the like, glass epoxy, and polyimide.

As the wall member 2 made of a conductive material, a frame member or the like is used which is made of, for example, an Fe—Ni alloy such as an Fe—Ni—Co alloy, an Fe—Ni 42 alloy and the like, oxygen-free copper, aluminum, stainless steel, a Cu—W alloy, or a Cu—Mo alloy.

Figure 10:
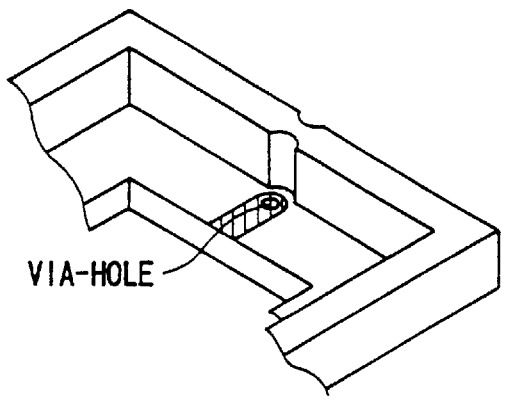
FIG. 10 is a perspective view showing a part of a package for housing a high-frequency semiconductor element of the invention.
Figure 11:
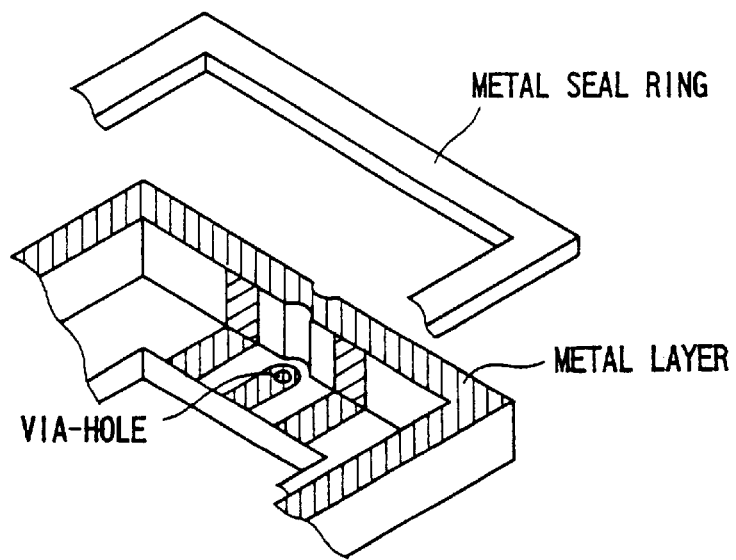
FIG. 11 is an exploded perspective view showing a part of another configuration of a package for housing a high-frequency semiconductor element of the invention.
Figure 12:
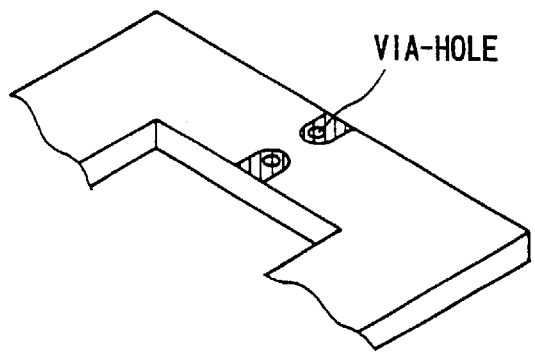
FIG. 12 is a perspective view showing a part of another configuration of a package for housing a high-frequency semiconductor element of the invention.
Figure 13:
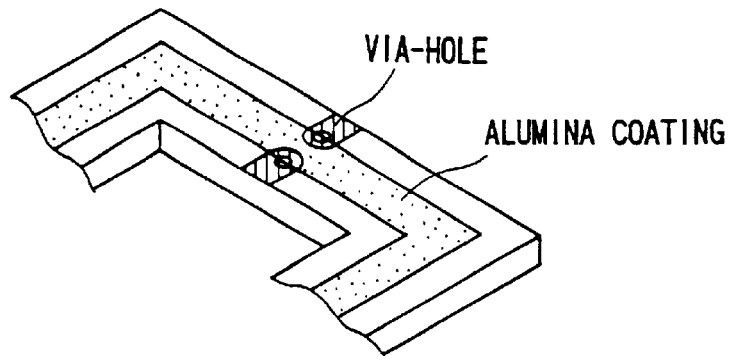
FIG. 13 is a perspective view showing a part of another configuration of a package for housing a high-frequency semiconductor element of the invention.

As the wall member 2, a cap may be used which is made of a dielectric or conductive material and also serves as a cover of the package. Other than a configuration that the wall member 2 for forming the hermetic seal portion is joined between the pair of line conductors 4 as shown in FIGS. 1 and 2, the hermetic seal portion of the package may have a configuration such as: a dielectric wall is used in a case where a multilayer structure is necessary; the dielectric wall which is additionally equipped with a metallized metal layer for attaching a metal member thereon is used; a feedthrough is structured on a substrate which is not equipped with a monolayer dielectric wall or a similar wall thereon; and a dielectric coating such as alumina coating is applied instead of the dielectric wall. FIG. 10 shows a configuration that a dielectric wall is used in a case where a multilayer structure is necessary. This dielectric wall is entirely formed by ceramics into a multilayer structure. FIG. 11 shows a configuration that the dielectric wall is provided with a metallized metal layer for attaching a metal member such as a metal seal ring on the dielectric wall. FIG. 12 shows a configuration that a feedthrough is structured on a substrate which is not equipped with a monolayer dielectric wall or a sililar wall thereon. FIG. 13 shows a configuration that a dielectric coating such as alumina coating for sealing a resin is applied instead of a dielectric wall.

A thickness t1+t2 and width W3 of the dielectric substrate 1, as well as a height h, a width W4, and a wall thickness L1 of parts 39 and 40 of the wall member 2 exluding parts 37 and 38 facing the pair of line conductors 4, 4 are set to optimize signal transmission properties at a frequency of a transmitted high-frequency signal and to reduce losses. As to the wall thickness of the wall member 2, between the parts 37 and 38 facing the pair of line conductors 4, 4, it is necessary to set an interval L2 so as not to overlap the line conductors 4 connected to the through conductors 6, 6 which are set to be λ/4 (L2≦L3). The wall thickness of the parts 39 and 40 on both sides of the parts 37 and 38 may be the same as L2 (L1=L2) or may be thicker than L2 (L2<L1). When the wall thickness L1 of the parts 39 and 40 on both sides is thicker (L2<L1) as shown in FIG. 1, a joining strength between the dielectric substrate 1 and the wall member 2 can be improved, so that a reliability as a hermetic seal portion is increased.

The ground conductor 3, the line conductors 4, the inside-layer line conductor 5 and the through conductors 6 are formed by using such a metal material for a high-frequency line conductor as Cu, MoMn+Ni+Au, W+Ni+Au, Cr+Cu, Cr+Cu+Ni+Au, Ta$_2$N+NiCr+Au, Ti+Pd+Au, and NiCr+Pd+Au, by thick film printing, metallizing, various methods of thin film forming, plating treatment or the like. A thickness and a width of the above conductors, for example, the width W1 of the line conductor 4, the width W2 of the inside-layer line conductor 5, the length t and the diameter D1 of the through conductors 6 are set as necessary, by considering the frequency of the high-frequency signal to be used, the match of the characteristic impedance and so on.

The ground conductor 3, not only formed by covering the bottom face of the dielectric substrate 1 as a conductor layer, but also may be formed by joining a conductive substrate to the bottom face of the dielectric substrate 1 via a metallized metal layer or the like. Further, in a case where the ground conductor 3 is formed as the conductor layer, it is generally adhered over the most of the bottom face of the dielectric substrate 1, where the thickness thereof is set to be about 20 $\mu$m in the case of a thick film or about 5 $\mu$m in the case of a thin film.

The width W1 of the pair of line conductors 4, 4 and the width W2 of the inside-layer line conductor 5 are generally set so as to be W1≧W2 as necessary in accordance with the required specifications, so that the widths match an ideal characteristic impedance.

Further, it is enough that a distance between the line conductor 4 and the inside-layer line conductor 5, that is, the length t of the through conductor 6, as well as the diameter D1 of the through conductor 6 have inductance component in which a characteristic impedance matches with respect to an increase of capacitance component of the inside-layer line conductor 5 and the ground conductor 3. Although it is preferable in view of the high-frequency characteristic that the through conductor 6 is a so-called via-hole conductor which is filled with a conductive material, it may be a so-called through-hole conductor, the inside of which is not completely filled. A sectional shape thereof may be not only a circle but also a rectangular or an ellipse.

Figure 14:
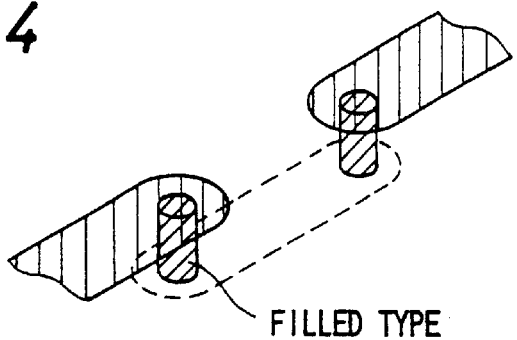
FIG. 14 is a perspective view explaining a via-hole conductor.
Figure 15:
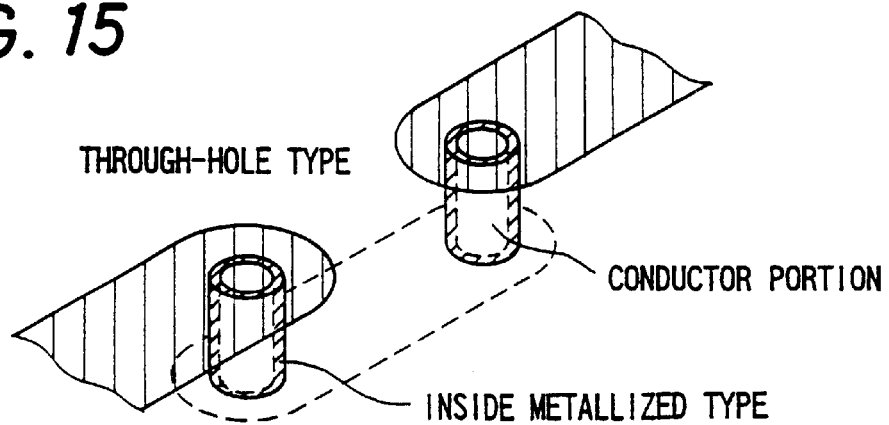
FIG. 15 is a perspective view explaining a through-hole conductor.

FIG. 14 shows a through conductor 6 using a via-hole conductor, the inside of which is filled with a conductive material. A sectional shape of the via-hole conductor may be an ellipse, a circle or a rectangular. FIG. 15 shows a through conductor 6 using a through-hole conductor, whose inside is not completely filled and whose inner wall is metallized. A sectional shape of the through-hole conductor may be an ellipse, a circle or a rectangular.

A via-hole conductor can lower resistance in the whole conductor, so that it is preferable in view of the high-frequency characteristic to use the via-hole conductor. Further, the inside of the via-hole conductor is completely filled and hence the diameter thereof can be decreased, so that a production accuracy is improved. Therefore, a deviation from a target dimension such as $\lambda$/4 can be decreased.

In the high-frequency input/output feedthrough of the invention, as shown in FIG. 7, a top face ground conductor 33 and side-face ground conductors 34, 35a, 35b may be further provided on a top face 30 of the wall member 2 and respective side faces 31 of the wall member 2 and respective side faces 32a and 32b of the dielectric substrate 1 (1a and 1b). In the case of providing them, since the respective ground conductors 33; 34, 35a, 35b approach an ideal ground potential (potential=0), a shielding effect for high-frequency signals can be enhanced.

Figure 3:
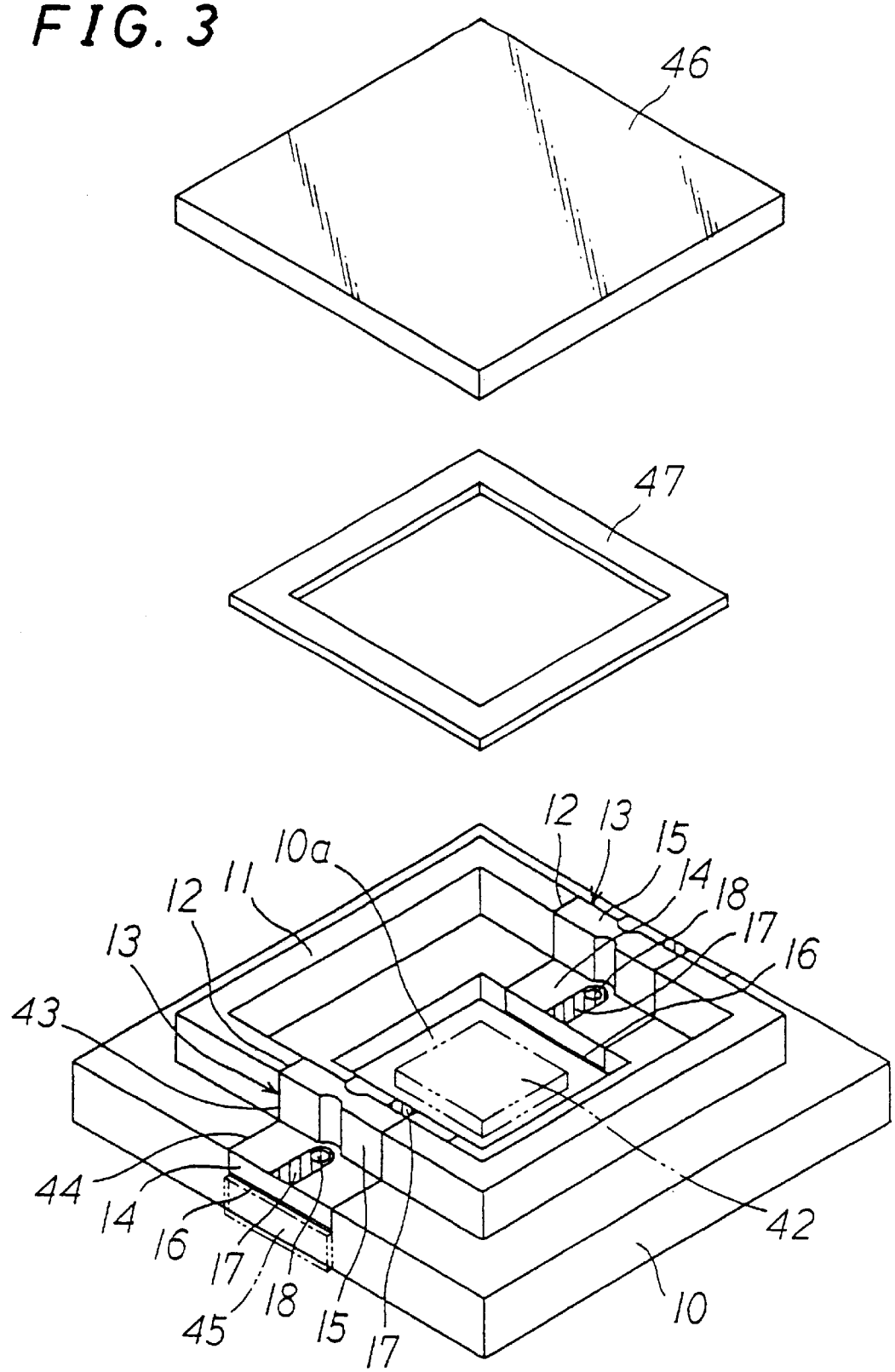
FIG. 3 is an exploded perspective view showing an embodiment of a package for housing a high-frequency semiconductor element of the invention.

Next, the package for housing a high-frequency semiconductor element of the invention will be described with reference to the accompanying drawings. FIG. 3 is an exploded perspective view showing an embodiment of the package for housing a high-frequency semiconductor element of the invention.

In FIG. 3, a mounting portion 10a for mounting a high-frequency semiconductor element 42 is formed on the top face of a substrate 10 made of a dielectric or conductive material. While the mounting portion 10a is formed into a recessed shape in the embodiment, the portion may be formed as a flat plane on the substrate 10. A frame 11 joined onto the substrate 10 so as to surround the mounting portion 10a is made of a dielectric or conductive material in the same manner as the substrate 10.

An input/output feedthrough attaching portion 12 is a first cutaway portion 43 formed by cutting away the frame 11, and the bottom face of the attaching portion is electrically conductive. In the embodiment, a second cutaway portion 44 is formed at the substrate 10 so as to constitute the input/output feedthrough attaching portion 12. In a case where the substrate 10 and the frame 11 are made of a conductive material, the bottom face of the input/output feedthrough attaching portion 12 is naturally conductive. In a case where the substrate 10 and the frame 11 are made of a dielectric, a conductor layer is formed to cover the bottom face, thereby making the bottom face conductive. The bottom face is grounded via the substrate 10 and frame 11 which are made of a conductive material or via ground conductor layers 45 which are formed so as to cover the substrate 10 made of a dielectric material, respectively.

A high-frequency input/output feedthrough 13 of the invention as described above is fitted into the input/output feedthrough attaching portion 12. A dielectric substrate 14, a wall member 15 which is made of a dielectric or conductive material and joined onto the top face of the dielectric substrate 14, a ground conductor 16 disposed to the bottom face of the dielectric substrate 14, and a pair of line conductors 17, 17 formed in line with each other on both sides of the wall member 15 on the top face of the dielectric substrate 14 are disposed. Through conductors 18 electrically connect both ends of an inside-layer line conductor (not shown in FIG. 3, denoted by reference numeral 5 in FIG. 1) to respective end portions on both sides of the wall member 15 of the pair of line conductors 17, 17, and an Interval of the through conductors 18 is set to be a quarter of the wavelength $\lambda$ of the frequency signal to be used. The ground conductor 16 is connected to the conductive bottom face of the input/output feedthrough attaching portion 12 and is grounded.

The package for housing a high-frequency semiconductor element of the invention is equipped with the high-frequency input/output feedthrough 13 of the invention configured in the above manner, as a high-frequency input/output feedthrough. Therefore, it is possible to improve the adhesion strength of the hermetic seal portion as aforementioned to prevent the hermetic seal portion from being delaminated and being damaged due to thermal stress, as well as to realize a highly reliable package for housing a high-frequency semiconductor element which has excellent transmission characteristics to the high-frequency signal to be used in a desired specific frequency band and which causes no break in the line conductor due to corrosion.

The line conductor 17 is connected to a terminal electrode of the high-frequency semiconductor element 42 mounted on the mounting portion 10a and to a wiring conductor of an external circuit, via a wire, ribbon or the like, so that the high-frequency semiconductor element 42 in the package is electrically connected to the external circuit. A cover 46 made of an Fe—Ni alloy such as an Fe—Ni—Co alloy and an Fe—Ni 42 alloy, oxygen-free copper, aluminum, stainless steel, a Cu—W alloy, a Cu—Mo alloy or the like is attached to the top face of the frame 11 by soldering, high-melting metal solder such as AuSn solder, or AuGe solder, seam welding, or the like. As a result, the high-frequency semiconductor element is housed in the package in a hermetically sealed manner, thereby constituting a high-frequency semiconductor device as a product.

In accordance with the specifications of the package, the substrate 10 and the frame 11 are made of the same dielectric material as the dielectric substrate 14 of the high-frequency input/output feedthrough 13 or the same metal as the above-shown frame 11, and in a case where they are made of dielectric material, at least the bottom face of the input/output feedthrough attaching portion 12 is made to be conductive.

The substrate 10 and the frame 11 are joined together by the high-melting metal solder such as AgCu solder, AuSn solder, and AuGe solder. The high-frequency input/output feedthrough 13 is fitted into the input/output feedthrough attaching portion 12 and joined thereto by a similar high-melting metal solder.

Figure 8:
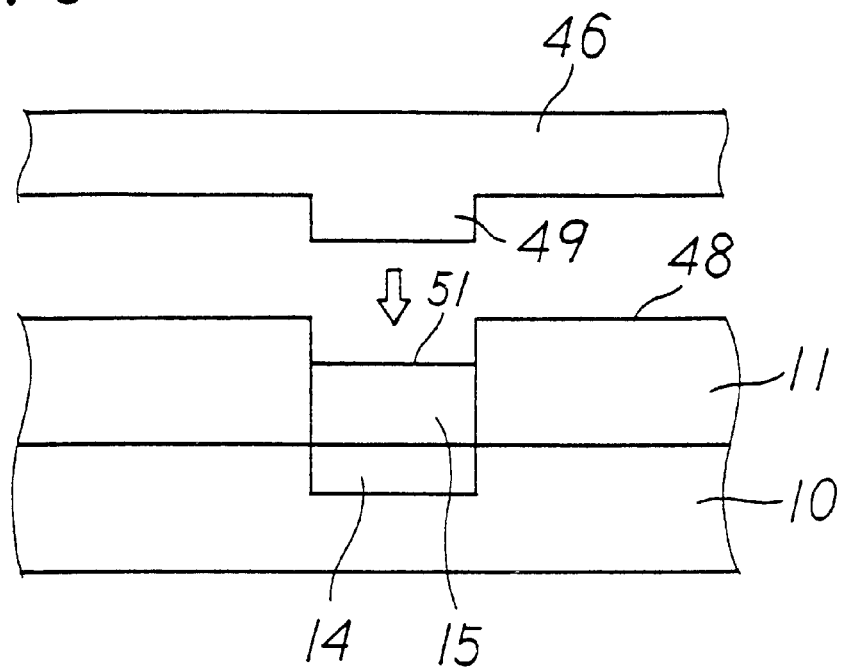
FIG. 8 is a sectional view showing another embodiment of the package for housing a high-frequency semiconductor element of the invention.

In the embodiment, the top face of the wall member 15 is cofacial with the top face of the frame 11. According to this configuration, a flat-plate-like cover 46 is attached to these top faces directly or via a metal seal member 47, so that the high-frequency semiconductor element 42 mounted on the mounting portion 10*a* can be readily sealed inside in a hermetic manner. Further, as shown in FIG. 8, in a case where it is difficult to make the top face 51 of the wall member 15 cofacial with the top face 48 of the frame 11, the high-frequency semiconductor element 42 can be hermetically sealed and housed inside in the same manner by the cover 46 having a projected portion 49 for bridging a gap between them, or further via a metal sealing member for bridging the gap.

Further, while the high-frequency input/output feedthroughs 13 are fixed on the respective sides of the substrate 10 in the embodiment, it is possible to fix the feedthrough on another position as necessary. A plurality of feedthroughs may be fixed on one side, in which case, a plurality of input/output feedthrough attaching portions 12 are disposed to fix the plurality of high-frequency input/output feedthroughs 13 in parallel.

Furthermore, on the top face of the wall member 15 of the high-frequency input/output feedthrough 13 and on the side faces of the wall member 15 and the dielectric substrate 14, a top face ground conductor and side-face ground conductors may be disposed. In the case of disposing them, the respective ground conductors are grounded in an ideal manner (potential=0) and a shielding effect for high-frequency signals can be enhanced.

Figure 9:
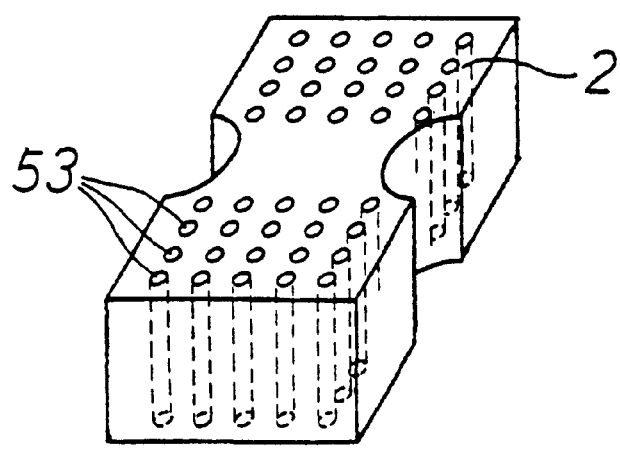
FIG. 9 is a perspective view showing a wall member used in a high-frequency input/output feedthrough of the invention.

Still further, the ground conductor 16, the top face ground conductor 33 and the side-face ground conductors 34, 35*a*, 35*b*, not only formed to be conductor film layers made of metal, but also may be caused to function as substantially continuous ground layers in the same manner as the conductor film layers, by arranging a lot of through conductors 53 as shown in FIG. 9 or by coupling them with each other. In another embodiment, they may be formed by attaching a metal plate or a metal block, in place of the film layers.

Figure 4:
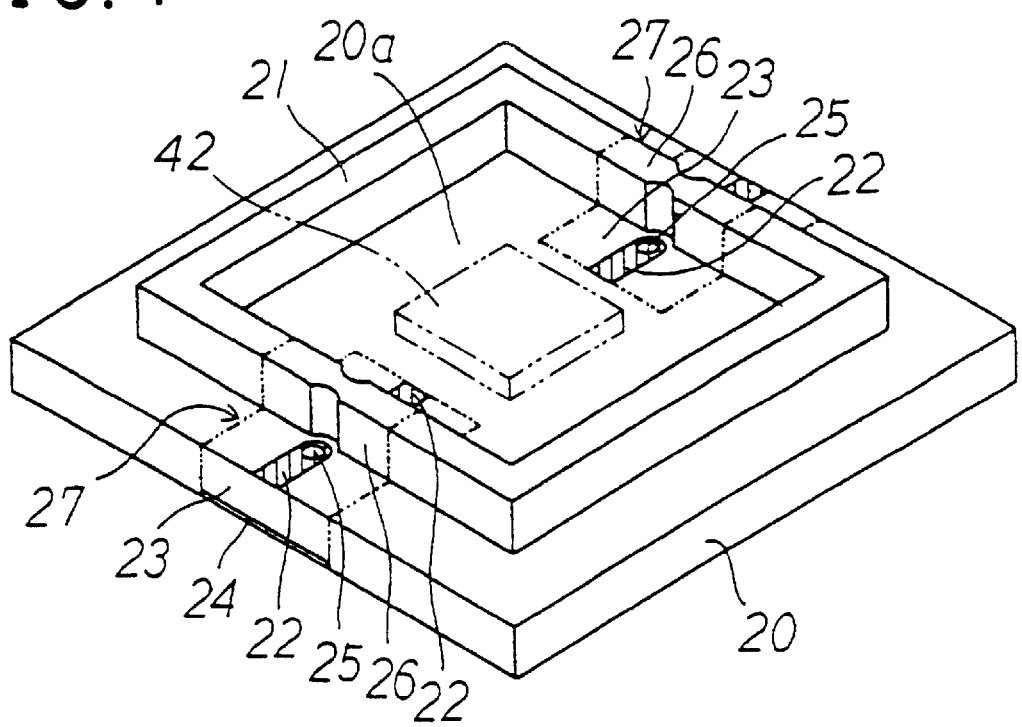
FIG. 4 is a perspective view showing another embodiment of a package for housing a high-frequency semiconductor element of the invention.

Next, FIG. 4 is a perspective view showing another embodiment of the package for housing a high-frequency semiconductor element of the invention.

In FIG. 4, reference numeral 20 denotes a dielectric substrate, which is made of the same material as the above-said dielectric substrate 14 and on the top face of which a mounting portion 20*a* for mounting the high-frequency semiconductor element 42 is provided. While the embodiment shows an example that the mounting portion 20*a* is formed into flat-face shape, it may be formed into recessed shape. In the embodiment, the following components are provided: a dielectric frame 21 joined onto the top face of the dielectric substrate 20; a pair of line conductors 22 formed in line with each other on both sides of the dielectric frame 21 on the top face of the dielectric substrate 20; a ground conductor 24 disposed so as to face the line conductors 22, on the bottom face of a portion 23 of the dielectric substrate constituting a high-frequency input/output feedthrough portion 27 indicated by phantom line at least in FIG. 4 of the dielectric substrate 20; and through conductors 25 for electrically connecting both ends of an inside-layer line conductor (not shown) to respective end portions of the pair of line conductors 22, 22, the end portions being on both sides of a part corresponding to a wall member 26 constituting the high-frequency input/output feedthrough portion 27 of the dielectric frame 21, and an interval between the through conductor 25 being set to be a quarter of the wavelength λ of the frequency signal to be used. In this configuration, the high-frequency input/output feedthrough portion 27 comprising the pair of line conductors 22 the portion 23 of, the dielectric substrate, the ground conductor 24, the inside layer conductor, the through conductors 25 and the wall member 26 is integrally formed into a package for housing a high-frequency semiconductor element of the invention.

According to the package for housing a high-frequency semiconductor element of the invention configured as described above, the input/output feedthrough portion for a high-frequency signal comprises: the pair of line conductors 22, 22 which are formed in line with each other on both sides of the dielectric frame 21 (wall member 26) on the top face of the dielectric substrate 20 (at the portion 23); and the inside-layer line conductor (not shown in FIG. 4, denoted by reference numeral 5 in FIG. 1) which is formed below the dielectric frame 21 (wall member 26) in the dielectric substrate 20 (at the portion 23) to be in line and parallel with the pair of line conductors 22, 22, and both ends of which are electrically connected by the through conductors 25, 25, respectively, to respective end portions of the pair of line conductors 22, 22 on both sides of the dielectric frame 21 (wall member 26). The interval between the through conductors 25, 25 is selected to be a quarter of the wavelength λ of the high-frequency signal to be used. Therefore, a highly reliable package for housing a high-frequency semiconductor element is realized which can prevent the hermatic seal portion from being delaminated and being damaged due to thermal stress since the adhesion strength of the hermetic seal portion is improved, which has excellent transmission characteristics to the high-frequency signal to be used in a desired specific frequency band, and which causes no break in the line conductor due to corrosion.

A terminal electrode of the high-frequency semiconductor element 42 mounted on the mounting portion 20*a*, and a wiring conductor of an external circuit are connected to the line conductor 22 via a wire, ribbon or the like, so that the high-frequency semiconductor element 42 in the package is electrically connected to the external circuit. A cover (46 in FIG. 3) which is made of the above-mentioned material is attached to the top face of the dielectric frame 21 by the above-mentioned attaching method. As a result, the high-frequency semiconductor element 42 is housed in the package in a hermetically sealed manner, thereby constituting a high-frequency semiconductor device as a product.

In accordance with the specifications of the package, the dielectric substrate 20 and the dielectric frame 21 are made of the same dielectric material as the dielectric substrate 23 of the high-frequency input/output feedthrough portion 27. From the point that the ground conductor 24 is required to be the ideal grounded state, it is preferable to form a ground conductor over the most of the bottom face of the dielectric substrate 20 in the same manner as the face of the ground conductor 24.

The dielectric substrate 20 and the dielectric frame 21 are joined together by, for example, laminating ceramic green sheets which will be formed into the dielectric substrate 20 and the dielectric frame 21 after fired, respectively, and firing the sheets so as to be integrated. The line conductor 22, the ground conductor 24, the inside-layer line conductor, and the through conductor 25 are formed so as to adhere on the dielectric substrate 20 by, for example, print-applying or embedding conductor paste of a predetermined pattern to the dielectric substrate 20 and then firing the paste so as to be integrated with the dielectric substrate 20.

In the embodiment of FIG. 4, a part of the dielectric frame 21, corresponding to the wall member 26 of the high-frequency input/output feedthrough portion 27, is integrated with the dielectric frame 21, and the top face of the wall member 26 is made cofacial with the top face of the dielectric frame 21. As a result, the cover (denoted by reference numeral 46 in FIG. 3) is attached onto the top face thereof directly or via a frame-like metal seal member (denoted by reference numeral 47 in FIG. 3), whereby the high-frequency semiconductor element 42 mounted on the mounting portion 20a can be readily housed inside in a hermetically sealed manner. Further, there may be the above-mentioned gap.

Further, while the high-frequency input/output feedthrough portions 27 are disposed one by one on both sides of the dielectric substrate 20 in the embodiment, the feedthrough portion 27 may be disposed on another position as necessary, or a plurality of high-frequency input/output feedthrough portions 27 may be disposed on one side.

Furthermore, also in the package for housing a high-frequency semiconductor element of the invention, on the top face of the dielectric frame 21 corresponding to the wall member 26 of the high-frequency input/output feedthrough portion 27 and on the side faces of the wall member 26 and the dielectric substrate 23, the top face ground conductor denoted by reference numeral 33 of FIG. 7 and side-face ground conductors denoted by reference numerals 34, 35a, 35b may be disposed. In the case of disposing them, the respective ground conductors are grounded in an ideal manner (potential=0) and a shielding effect for high-frequency signals can be enhanced.

Still further, the ground conductor 24, the top face ground conductor and the side-face ground conductor, not only formed to be conductor film layers made of metal, but also may be caused to function as substantially continuous ground layers in the same manner as the conductor film layers, by arranging a lot of through conductors 53 as shown in FIG. 9 or coupling them with each other. In another embodiment, they may be formed by attaching a metal plate or a metal block.

Hereinafter, specific examples of the invention will be described.

EXAMPLE 1

By using a ceramic forming method in which so-called cosintering is conducted by the ceramic green sheet multi-layer technique, the high-frequency input/output feedthrough of the invention was produced. The wall member 2 in which length (wall thickness) L2×width W4×thickness h is 0.5 mm×1.0 mm×0.51 mm and which is made of alumina is joined onto the dielectric substrate 1 of FIG. 1 in which length L4×width W3×thickness (t1+t2) is 1.5 mm×1.0 mm×0.2 mm and which is made of alumina (the relative dielectric constant $\in_r$=9.0). The ground conductor 3 which is made of tungsten of a thickness of about 10 μm and Ni+Au plating of a thickness of 2 to 6 μm is formed on the bottom face of the dielectric substrate 1. The pair of line conductors 4 made of the same material are formed on the top face of the substrate 1. The inside-layer line conductor 5 and the through conductors 6 for electrically connecting both ends of the inside-layer line conductor 5 to the respective ends of the pair of line conductors 4 are formed in the high-frequency input/output feedthrough, respectively. The width W1 of the pair of line conductors 4 is 0.2 mm, the width W2 of the inside-layer line conductor 5 is 0.08 mm, the diameter D1 of the through conductors 6 is 0.1 mm, and the length t of the through conductors 6 is 0.125 mm. Further, the interval for the through conductors 6 is set to be 0.53 mm because the wavelength λ0 of a high-frequency signal of 47 GHz in the air is 6.38 mm (=$3\times10^{11}/(47\times10^9)$) and a quarter of the wavelength λ (=λ0/√$\in_r$) in a dielectric material is 0.53 mm when the dielectric constant is $\in_r$ is 9.0. As a result, a high-frequency input/output feedthrough A was obtained as the high-frequency input/output feedthrough of the invention.

As a high-frequency input/output feedthrough of a comparison example, a high-frequency input/output feedthrough B with the conventional configuration, in which a pair of line conductors as microstrip lines are connected to each other by a strip line formed between a dielectric substrate and a wall member, was obtained in the substantially same manner as described above.

The high-frequency input/output feedthroughs A and B were applied to input/output portions of a package for housing a high-frequency semiconductor element. In the frequency band of 0 to 110 GHz, the frequency characteristics of the return loss (per feedthrough) was obtained by use of a commercially available network analyzer which is equipped with a prober and conversion substrates capable of measuring a contact in front and rear thereof. The frequency characteristics of the insertion loss (per feedthrough) which was measured as an evaluation index of the transmitted amount in the input signal by the same measuring method, were obtained.

Figure 5A:
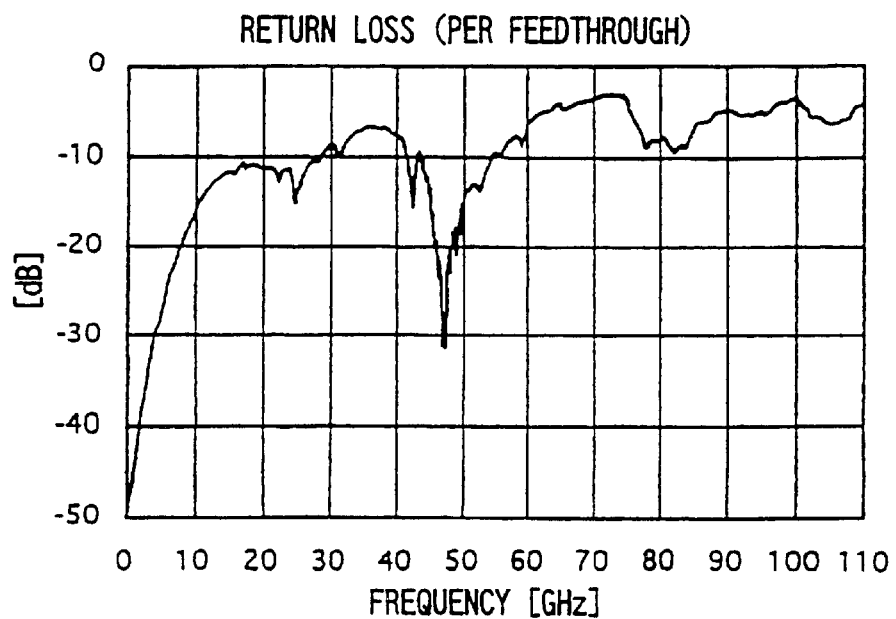
FIGS. 5A and 5B are graphs showing frequency characteristics of return loss and insertion loss in a high-frequency input/output feedthrough of the invention, respectively.
Figure 5B:
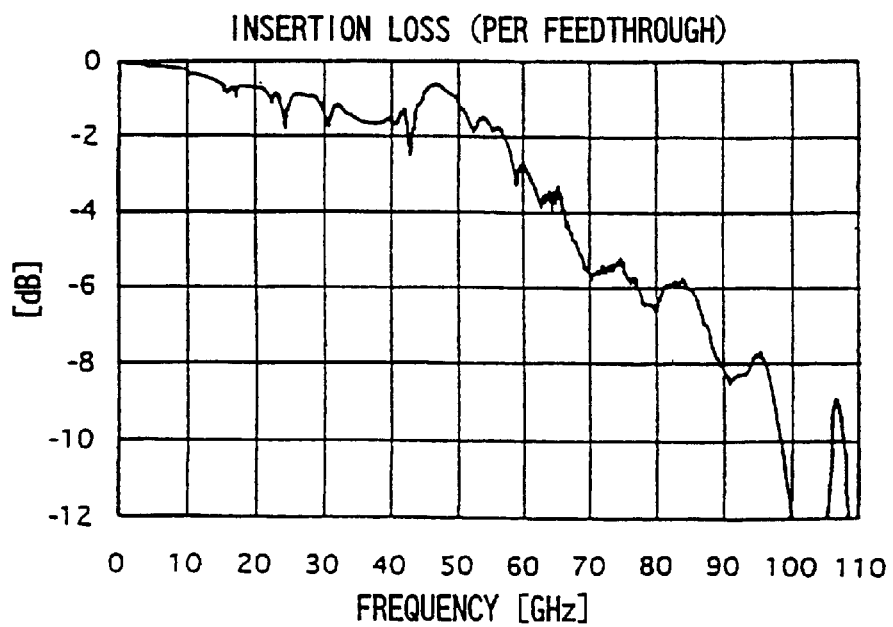

With respect to the results of these measurements, the frequency characteristics of the return loss and the frequency characteristics of the insertion loss are shown, respectively, in the graphs of FIGS. 5A and 5B, regarding the high-frequency input/output feedthrough A of the invention at first. In FIGS. 5A and 5B, the abscissa indicates the frequency in the range of 0 to 110 GHz (unit: GHz), and the ordinate indicates the return loss or Insertion loss (unit: dB).

From the results shown in FIGS. 5A and 5B, according to the high-frequency input/output feedthrough A of the invention, the return loss is −15 dB or less and the insertion loss is −1.0 dB or more in the range of approximately 5 GHz (±2.5 GHz) about the target frequency 47 GHz, so that it will be seen that the feedthrough A has excellent transmission characteristics with respect to a high-frequency signal of frequency 47 GHz, which is a target high-frequency signal to be used.

Figure 6A:
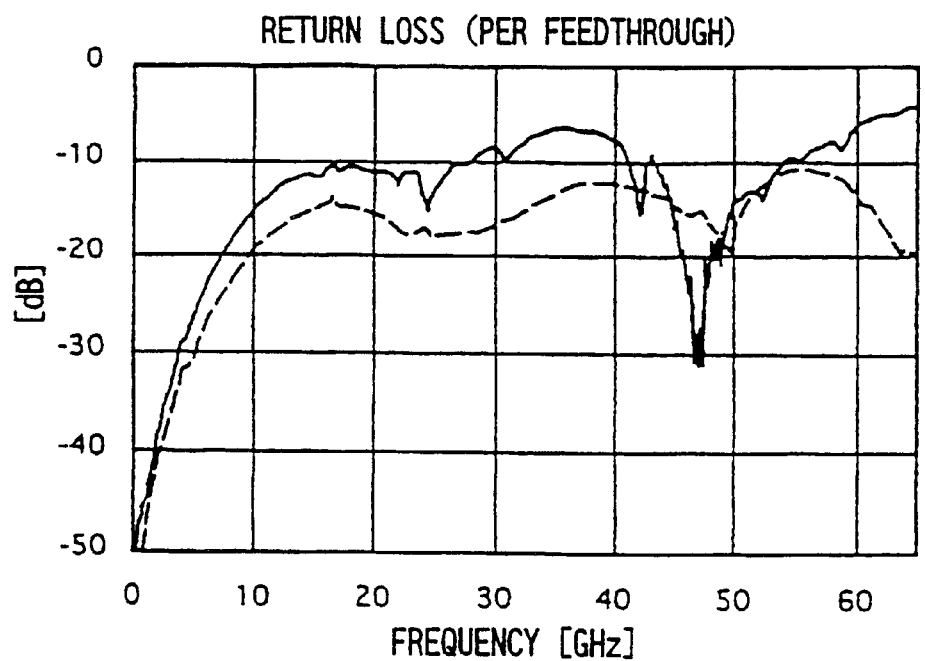
FIGS. 6A and 6B are graphs showing frequency characteristics of return loss and insertion loss in a high-frequency input/output feedthrough of the invention and a high-frequency input/output feedthrough of a comparison example, respectively.
Figure 6B:
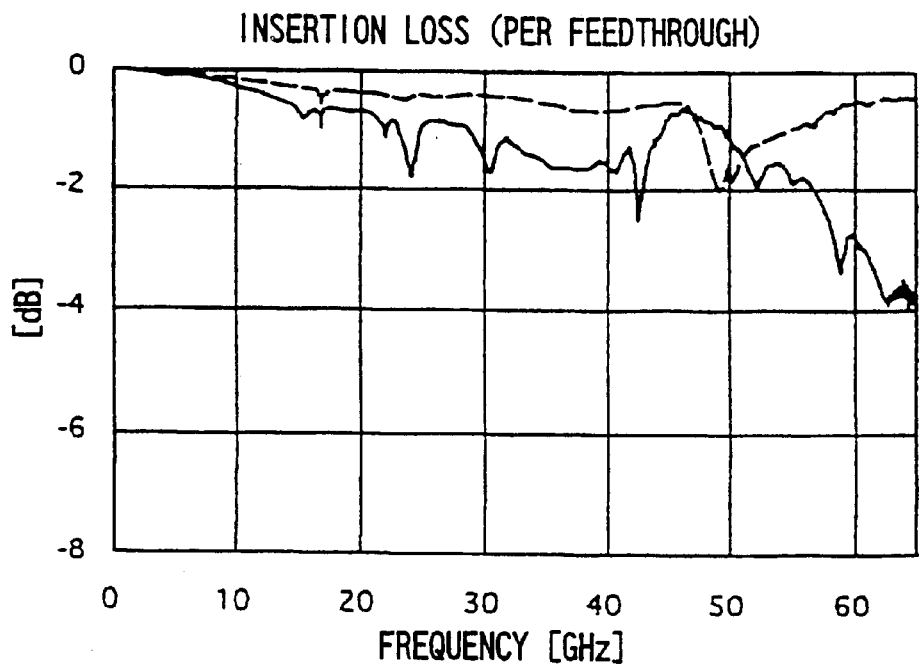

Next, regarding the high-frequency input/output feedthrough A of the invention and the high-frequency input/output feedthrough B of the comparison example, comparisons in the frequency characteristics of the return loss and the frequency characteristics of the insertion loss are shown, respectively, in the graphs of FIGS. 6A and 6B. In FIGS. 6A and 6B, the abscissa indicates the frequency in the range of 0 to 65 GHz (unit: GHz) and the ordinate indicates the return loss or insertion loss (unit: dB), and the characteristic curves of the high-frequency input/output feedthroughs A is indicated by solid line and that of the high-frequency input/output feedthrough B is indicated by broken line.

From the results shown in FIGS. 6A and 6B, in the range of approximately 5 GHz (±2.5 GHz) about the target frequency 47 GHz, the high-frequency input/output feedthrough B caused slot resonance around 50 GHz, thereby degrading the transmission characteristics of the high-frequency signals. On the contrary, it will be seen that the high-frequency input/output feedthrough A of the invention does not cause such resonance as seen in the high-frequency input/output feedthrough B, and has excellent transmission characteristics in 47 GHz±2.5 GHz of the required frequency range.

Moreover, while delamination was observed between the dielectric substrate and the wall member in the conventional high-frequency input/output feedthrough B, delamination was not observed in the high-frequency input/output feedthrough A of the invention. It was also found that, according to the high-frequency input/output feedthrough of the invention, the adhesion strength between the dielectric substrate and the wall member is strong, so that the seal portion is highly reliable.

Furthermore, a high temperature/humidity bias test was conducted to the high-frequency input/output feedthroughs A and B. For example, while a bias voltage was constantly applied between the line conductor and the ground conductor, a cycle of leaving the feedthroughs in ordinary temperature/humidity, leaving in temperature of 65° C. and humidity of 95%RH, and leaving in ordinary temperature/humidity was repeated for approximately 30 times. As a result, while corrosion was observed at a part where the line conductor enters into the wall member in some of the high-frequency input/output feedthroughs B due to the irregularities in production, it was found that no corrosion was observed in the line conductors, so that there is no fear of break in the line conductors in the high-frequency input/output feedthroughs A of the invention.

As shown above, according to the high-frequency input/output feedthrough of the invention, it is possible to realize a highly reliable high-frequency input/output feedthrough which can prevent the seal from damaged due to thermal stress since the adhesion strength of the hermetic seal portion is improved, which has excellent transmission characteristics with respect to a high frequency signal of a desired specific frequency range, and which causes no break in the line conductor due to corrosion.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A high-frequency input/output feedthrough, comprising:
   a dielectric substrate having a ground conductor on a bottom surface thereof;
   a wall member of a dielectric or conductive material joined to a top surface of the dielectric substrate protruding above the top surface, at least a portion of the wall member defining a recess;
   a first line conductor and a second line conductor formed on the top surface of the dielectric substrate in line with each other, each line conductor having a wall member adjacent end so that the line conductors are separated by a portion of the wall member;
   an inside-layer line conductor formed within the dielectric substrate, in line with the first and second line conductors and passing beneath the wall member; and
   through connectors at a first end and at a second end of the inside-layer line conductor electrically connected to respective wall member adjacent ends of the first and the second line conductors with a distance between the through conductors set to be a quarter of a wavelength of a high-frequency signal to be used,
   wherein the recess extends along the surface of the wall member in a direction normal to the top surface of the substrate, and
   wherein the wall member adjacent ends are at least partially in the recess, such that
   the portion of the wall member separating the wall member adjacent ends of the line conductors has a thickness that is less than a thickness of portions of the wall member not separating the wall member adjacent ends of the line conductors.

2. The high-frequency input/output feedthrough of claim 1, wherein a width (W2) of the inside-layer line conductor is selected to be equal to or narrower than a width (W1) of the pair of line conductors (W1≧W2).

3. The high-frequency input/output feedthrough of claim 1 or 2, wherein:
   the wall member is made of a dielectric material;
   a top face ground conductor is provided on the top face of the wall member; and
   side-face ground conductors are provided on respective side faces of the wall member and the dielectric substrate, respectively.

4. A package for housing a high-frequency semiconductor element, comprising:
   a substrate having a mounting portion for mounting a high-frequency semiconductor element on a top face thereof;
   a frame joined onto the substrate so as to surround the mounting portion;
   an input/output feedthrough attaching portion which is formed by cutting away the frame, a bottom face of the portion being made conductive; and
   a high-frequency input/output feedthrough of claim 1 which is fitted into the input/output feedthrough attaching portion.

5. A package for housing a high-frequency semiconductor element, comprising:
   a dielectric substrate having a ground conductor on a bottom surface thereof and a mounting portion for mounting a high-frequency semiconductor element on a top surface thereof;

a dielectric frame joined to the top surface of the dielectric substrate protruding above the top surface so as to surround the mounting portion, at least a portion of the dielectric frame defining a recess;

a first line conductor and a second line conductor formed on the top surface of the dielectric substrate in line with each other, each line conductor having a dielectric frame adjacent end so that the line conductors are separated by a portion of the dielectric frame;

an inside-layer line conductor formed within the dielectric substrate, in line with the first and second line conductors and passing beneath the dielectric frame; and through connectors at a first end and at a second end of the inside-layer line conductor electrically connected to respective dielectric frame adjacent ends of the first and the second line conductors with a distance between the through connectors set to be a quarter of a wavelength of a high-frequency signal to be used, wherein the recess extends along the surface of the dielectric frame in a direction normal to the top surface of the substrate, and wherein the dielectric frame adjacent ends are at least partially in the recess, such that the portion of the dielectric frame separating the dielectric frame adjacent ends of the line conductors has a thickness that is less than a thickness of portions of the dielectric frame not separating the dielectric frame adjacent ends of the line conductors.

6. The package for housing a high-frequency semiconductor element of claim 5, wherein a width (W2) of the inside-layer line conductor is selected to be equal to or narrower than a width (W1) of the pair of line conductors (W1≧W2).

* * * * *